United States Patent
Kawanishi et al.

(10) Patent No.: US 12,286,731 B2
(45) Date of Patent: Apr. 29, 2025

(54) GLASS CLOTH, PREPREG, AND PRINTED WIRING BOARD

(71) Applicant: NITTO BOSEKI CO., LTD., Fukushima (JP)

(72) Inventors: Hiroyuki Kawanishi, Koriyama (JP); Kazuaki Minami, Koriyama (JP); Koichi Nakamura, Koriyama (JP); Yuichiro Ito, Fukushima (JP); Hirotaka Ikejiri, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 0 days.

(21) Appl. No.: 18/837,977

(22) PCT Filed: Jun. 1, 2023

(86) PCT No.: PCT/JP2023/020430
§ 371 (c)(1),
(2) Date: Aug. 13, 2024

(87) PCT Pub. No.: WO2023/238763
PCT Pub. Date: Dec. 14, 2023

(65) Prior Publication Data
US 2025/0109530 A1    Apr. 3, 2025

(30) Foreign Application Priority Data
Jun. 8, 2022  (JP) .................. 2022-092909

(51) Int. Cl.
*D03D 1/00*    (2006.01)
*D03D 15/267*    (2021.01)
*H05K 1/03*    (2006.01)

(52) U.S. Cl.
CPC ......... *D03D 1/0082* (2013.01); *D03D 15/267* (2021.01); *H05K 1/0306* (2013.01); *H05K 1/038* (2013.01)

(58) Field of Classification Search
CPC .. D03D 1/0082; D03D 15/267; H05K 1/0306; H05K 1/038; Y10T 442/30
See application file for complete search history.

(56) References Cited

U.S. PATENT DOCUMENTS

| | | |
|---|---|---|
| 10,934,640 B2 | 3/2021 | Ikejiri et al. |
| 2012/0156955 A1 | 6/2012 | Endo et al. |
| 2019/0153635 A1 | 5/2019 | Ikejiri et al. |
| 2022/0356609 A1 | 11/2022 | Sato et al. |

FOREIGN PATENT DOCUMENTS

| | | |
|---|---|---|
| JP | 2019-019431 A | 2/2019 |
| JP | 6536764 B1 | 7/2019 |
| WO | 2011/024870 A1 | 3/2011 |
| WO | 2017/038240 A1 | 3/2017 |
| WO | 2017/168921 A1 | 10/2017 |
| WO | 2021/251103 A1 | 12/2021 |

OTHER PUBLICATIONS

PCT/ISA/210 from International Application Publication PCT/JP2023/020430 with the English translation thereof.
PCT/ISA/237 from International Application Publication PCT/JP2023/020430.

*Primary Examiner* — Jennifer A Steele
(74) *Attorney, Agent, or Firm* — Carrier, Shende & Associates P.C.; Joseph P. Carrier; Fulchand P. Shende

(57) ABSTRACT

Provided is a glass cloth that can reduce a delay time difference of a printed wiring board and for which high productivity can be achieved. In the glass cloth, a glass filament diameter of the warp yarn and the weft yarn is from 0.5 to 4.5 μm, the filament number of each is from 150 to 3000, the weaving density of each is from 1.0 to 50.0 filaments/25 mm, the average yarn width of each is from 550 to 10000 μm, the fiber-opening efficiency coefficient of each is from 0.600 to 1.500, the ratio of the filament number to the filament diameter is from 68.6 to 555.5, the geometric mean of the opening efficiency coefficients of the warp yarn and the weft yarn is from 0.770 to 1.200, and the thickness of the glass cloth is less than 10.0 μm.

6 Claims, No Drawings

GLASS CLOTH, PREPREG, AND PRINTED WIRING BOARD

TECHNICAL FIELD

The present invention relates to a glass cloth, a prepreg, and a printed wiring board.

BACKGROUND ART

Conventionally, a prepreg, which is glass cloth impregnated with a resin such as an epoxy resin or modified polyphenylene ether, has been used as an insulating material in a printed wiring board. The glass cloth is composed of a warp yarn and a weft yarn, which are formed by bundling together a plurality of glass filaments.

In order to make electronic devices smaller and thinner, the printed wiring board and the prepreg also need to be made thinner. Therefore, a glass cloth having reduced thickness is required. As a glass cloth having a reduced thickness, there has been proposed a glass cloth having an increased warp yarn width and weft yarn width that is obtained by using a warp yarn and a weft yarn formed by bundling together a small number of glass filaments having a small fiber diameter to increase the warp yarn weaving density and weft yarn weaving density, and then performing a strong fiber-opening treatment (for example, see Patent Literature 1).

CITATION LIST

Patent Literature

Patent Literature 1: Japanese Patent No. 6536764

SUMMARY OF INVENTION

Technical Problem

It is known that in recent years, with the increase in speed and higher frequency of data communication, signal deterioration due to distortion called skew, which reduces signal quality, has become more noticeable in printed wiring boards, and there is a need to suppress the deterioration in signal quality during signal transmission (reduce the delay time difference). Additionally, with the increasing demand for thinner printed wiring boards, there is a need to increase the supply speed of glass cloth.

However, in the conventional glass cloth described in Patent Literature 1, due to factors such as the small number of filaments and the strong fiber-opening treatment, gaps exist in the warp yarn or the weft yarn, in particular the gaps between the glass filaments constituting the weft yarn, giving rise to problems such as the occurrence of unevenness in the yarn width of the warp yarn or weft yarn, and the occurrence of places in the printed wiring board where there is no glass cloth present. Further, if there are places in the printed wiring board where there is no glass cloth present, that is disadvantageous because a sufficient reduction in the delay time difference cannot be achieved. Moreover, the above-described conventional glass cloth has the disadvantage that sufficient productivity cannot be achieved due to the high weaving density.

Accordingly, it is an object of the present invention to overcome such disadvantages by providing a glass cloth that can reduce the delay time difference of a printed wiring board, suppress deterioration in signal quality, and achieve high productivity.

Solution to Problem

To achieve this objective, the glass cloth of the present invention is a glass cloth composed of a warp yarn and a weft yarn, each of which is formed by bundling together a plurality of glass filaments, wherein a filament diameter Dt of the glass filaments constituting the warp yarn and a filament diameter Dy of the glass filaments constituting the weft yarn are each independently in the range of 0.5 µm or more and 4.5 µm or less, a filament number Ft of the glass filaments constituting the warp yarn and a filament number Fy of the glass filaments constituting the weft yarn are each independently in the range of 150 or more and 3000 or less, a weaving density Wt of the warp yarn and a weaving density Wy of the weft yarn are each independently in the range of 1.0 filaments/25 mm or more and 50.0 filaments/25 mm or less, an average yarn width Bt of the warp yarn and an average yarn width By of the weft yarn are each independently in the range of 550 µm or more and 10000 µm or less, a warp yarn fiber-opening efficiency coefficient Pt determined from the Dt, Ft, Wt, and Bt using the following formula (1) is in the range of 0.600 or more and 1.500 or less, and a weft yarn fiber-opening efficiency coefficient Py determined from the Dy, Fy, Wy, and By using the following formula (2) is in the range of 0.600 or more and 1.500 or less, Rt, which is a ratio (Ft/Dt) of the filament number Ft of the glass filaments constituting the warp yarn to the filament diameter Dt of the glass filaments constituting the warp yarn, and Ry, which is a ratio (Fy/Dy) of the filament number Fy of the glass filaments constituting the weft yarn to the filament diameter Dy of the glass filaments constituting the weft yarn, are each independently in the range of 68.6 or more and 555.5 or less, Pt and the Py satisfy the following formula (3), and the glass cloth has a thickness of less than 10.0 µm:

$$Pt = \{(Bt/(Dt \times Ft)) \times Bt/(25000/Wt)\}^{1/2} \times \{(Dt \times Ft)/(25000/Wt)\} \quad (1)$$

$$Py = \{(By/(Dy \times Fy)) \times By/(25000/Wy)\}^{1/2} \times \{(Dy \times Fy)/(25000/Wy)\} \quad (2)$$

$$0.770 \leq (Pt \times Py)^{1/2} \leq 1.200. \quad (3)$$

According to the glass cloth of the present invention, by having the above configuration, it is possible to reduce a delay time difference of a printed wiring board, suppress deterioration in signal quality, and achieve high productivity.

Further, in the glass cloth of the present invention, it is preferred that the filament diameter Dt of the glass filaments constituting the warp yarn and the filament diameter Dy of the glass filaments constituting the weft yarn are each independently 2.0 µm or more and 3.8 µm or less, and that Pt and Py satisfy the following formula (4):

$$0.890 \leq (Pt \times Py)^{1/2} \leq 0.970. \quad (4)$$

The present invention also relates to a prepreg containing the glass cloth of the present invention and a printed wiring board containing the glass cloth of the present invention.

DESCRIPTION OF EMBODIMENT

Next, an embodiment of the present invention will be described in more detail.

The glass cloth of this embodiment is a glass cloth composed of a warp yarn and a weft yarn, each of which is formed by bundling together a plurality of glass filaments, wherein a filament diameter Dt of the glass filaments constituting the warp yarn and a filament diameter Dy of the glass filaments constituting the weft yarn are each independently in the range of 0.5 μm or more and 4.5 μm or less, a number of filaments Ft of the glass filaments constituting the warp yarn and a number of filaments Fy of the glass filaments constituting the weft yarn are each independently in the range of 150 or more and 3000 or less, a weaving density Wt of the warp yarn and a weaving density Wy of the weft yarn are each independently in the range of 1.0 filaments/25 mm or more and 50.0 filaments/25 mm or less, an average yarn width Bt of the warp yarn and an average yarn width By of the weft yarn are each independently in the range of 550 μm or more and 10000 μm or less, a warp yarn fiber-opening efficiency coefficient Pt determined from the Dt, Ft, Wt, and Bt using the following formula (1) is in the range of 0.600 or more and 1.500 or less, and a weft yarn fiber-opening efficiency coefficient Py determined from the Dy, Fy, Wy, and By using the following formula (2) is in the range of 0.600 or more and 1.500 or less, Rt, which is a ratio (Ft/Dt) of the filament number Ft of the glass filaments constituting the warp yarn to the filament diameter Dt of the glass filaments constituting the warp yarn, and Ry, which is a ratio (Fy/Dy) of the filament number Fy of the glass filaments constituting the weft yarn to the filament diameter Dy of the glass filaments constituting the weft yarn, are each independently in the range of 68.6 or more and 555.5 or less, Pt and Py satisfy the following formula (3), and the glass cloth has a thickness of less than 10.0 μm:

$$Pt = \{(Bt/(Dt \times Ft)) \times Bt/(25000/Wt)\}^{1/2} \times \{(Dt \times Ft)/(25000/Wt)\} \quad (1)$$

$$Py = \{(By/(Dy \times Fy)) \times By/(25000/Wy)\}^{1/2} \times \{(Dy \times Fy)/(25000/Wy)\} \quad (2)$$

$$0.770 \leq (Pt \times Py)^{1/2} \leq 1.200. \quad (3)$$

In the glass cloth of this embodiment, if the filament diameter Dt of the glass filaments constituting the warp yarn or the filament diameter Dy of the glass filaments constituting the weft yarn is less than 0.5 μm, continuous stable production is difficult. On the other hand, if the filament diameter Dt of the glass filaments constituting the warp yarn or the filament diameter Dy of the glass filaments constituting the weft yarn are each independently more than 4.5 μm, the glass cloth cannot be made sufficiently thinner.

The filament diameter Dt of the glass filaments constituting the warp yarn or the filament diameter Dy of the glass filaments constituting the weft yarn are each independently preferably in the range of 2.0 to 3.8 μm, more preferably in the range of 2.5 to 3.7 μm, and further preferably in the range of 2.6 to 3.6 μm.

Further, the ratio Dt/Dy of the filament diameter Dt of the glass filaments constituting the warp yarn to the filament diameter Dy of the glass filaments constituting the weft yarn is, for example, in the range of 0.90 or more and 1.10 or less, preferably in the range of 0.95 or more and 1.05 or less, more preferably in the range of 0.97 or more and 1.03 or less, further preferably in the range of 0.98 or more and 1.02 or less, particularly preferably in the range of 0.99 or more and 1.01 or less, and most preferably is 1.00.

Further, in the glass cloth of this embodiment, if the filament number Ft of the glass filaments constituting the warp yarn and the filament number Fy of the glass filaments constituting the weft yarn are each independently less than 150, it may not be possible to sufficiently suppress the occurrence of gaps between filaments. On the other hand, if the filament number Ft of the glass filaments constituting the warp yarn and the filament number Fy of the glass filaments constituting the weft yarn are each independently more than 3000, the glass cloth cannot be made sufficiently thinner.

The filament number Ft of the glass filaments constituting the warp yarn and the filament number Fy of the glass filaments constituting the weft yarn are each independently preferably in the range of 415 or more and 990 or less.

Further, the ratio Ft/Fy of the of filaments number Ft of the glass filaments constituting the warp yarn to the filament number Fy of the glass filaments constituting the weft yarn is, for example, in the range of 0.90 or more and 1.10 or less, preferably in the range of 0.95 or more and 1.05 or less, more preferably in the range of 0.97 or more and 1.03 or less, further preferably in the range of 0.98 or more and 1.02 or less, particularly preferably is in the range of 0.99 or more and 1.01 or less, and most preferably is 1.00.

Further, in the glass cloth of this embodiment, if the weaving density Wt of the warp yarn and the weaving density Wy of the weft yarn are each independently less than 1.0 filaments/25 mm, it may not be possible to sufficiently suppress the occurrence of gaps in the warp yarn and weft yarn. On the other hand, if the weaving density Wt of the warp yarn and the weaving density Wy of the weft yarn are each independently more than 50.0 filaments/25 mm, the productivity of the glass cloth cannot be sufficiently increased.

The weaving density Wt of the warp yarn and the weaving density Wy of the weft yarn are each independently preferably in the range of 2.0 filaments/25 mm or more and 40.0 filaments/25 mm or less, more preferably in the range of 3.0 filaments/25 mm or more and 33.0 filaments/25 mm or less, and further preferably in the range of 3.8 filaments/25 mm or more and 29.0 filaments/25 mm or less.

The ratio Wt/Wy of the weaving density Wt of the warp yarn to the weaving density Wy of the weft yarn is, for example, in the range of 0.90 or more and 1.10 or less, preferably in the range of 0.95 or more and 1.05 or less, more preferably in the range of 0.97 or more and 1.03 or less, further preferably in the range of 0.98 or more and 1.02 or less, particularly preferably in the range of 0.99 or more and 1.01 or less, and most preferably is 1.00.

Further, in the glass cloth of this embodiment, if the average yarn width Bt of the warp yarn and the average yarn width By of the weft yarn are each independently less than 550 μm, it may not be possible to sufficiently suppress the occurrence of gaps in the warp yarn and weft yarn. On the other hand, if the average yarn width Bt of the warp yarn and the average yarn width By of the weft yarn are each independently more than 10,000 μm, it may not be possible to sufficiently suppress the occurrence of gaps between the filaments.

The average yarn width Bt of the warp yarn and the average yarn width By of the weft yarn are each independently preferably in the range of 1000 μm or more and 5500 μm or less, and more preferably in the range of 1200 μm or more and 3450 μm or less.

Further, the ratio Bt/By of the average yarn width Bt of the warp yarn to the average yarn width By of the weft yarn is, for example, in the range of 0.80 or more and 1.20 or less, preferably in the range of 0.85 or more and 1.15 or less, more preferably in the range of 0.90 or more and 1.10 or less, further preferably in the range of 0.93 or more and 1.07 or less, particularly preferably in the range of 0.95 or more and 1.05, especially preferably in the range of 0.96 or more and 1.04 or less, and most preferably in the range of 0.97 or more and 1.03 or less.

The coefficient of variation of the yarn width of the warp yarn (standard deviation of the yarn width of the warp yarn/average yarn width Bt of the warp yarn), and the coefficient of variation of the yarn width of the weft yarn (standard deviation of the yarn width of the weft yarn/average yarn width By of the weft yarn) are each independently, for example, 0.20 or less, preferably 0.15 or less, more preferably 0.10 or less, and further preferably 0.05 or less. Further, the lower limit value of the coefficient of variation of the yarn width of the warp yarn and the coefficient of variation of the yarn width of the weft yarn can be 0.01. In addition, the average value of the coefficient of variation of the yarn width of the warp yarn and the coefficient of variation of the yarn width of the weft yarn is, for example, 0.20 or less, preferably 0.15 or less, more preferably 0.10 or less, and further preferably 0.05 or less.

Further, in the glass cloth of this embodiment, if the warp yarn fiber-opening efficiency coefficient Pt is less than 0.600 or more than 1.500, it is difficult to reduce the delay time difference of the printed wiring board. The warp yarn fiber-opening efficiency coefficient Pt is calculated from the Dt, Ft, Wt, and Bt using formula (1).

The warp yarn fiber-opening efficiency coefficient Pt is preferably in the range of 0.770 or more and 1.200 or less, more preferably in the range of 0.800 or more and 1.100 or less, further preferably in the range of 0.890 or more and 1.000 or less, and particularly preferably in the range of 0.925 or more and 0.970 or less.

Here, in formula (1), the part "Bt/(Dt×Ft)" reflects the occurrence frequency of gaps between the filaments, or, of filaments overlapping each other, in the filaments constituting the warp yarn. The more that "Bt/(Dt×Ft)" exceeds 1.000 and the larger, the greater the number of gaps between the filaments, and as a result of those gaps, it tends to be more difficult to reduce the delay time difference of the printed wiring board. On the other hand, the more that "Bt/(Dt×Ft)" is less than 1.000 and the smaller, the greater the number of filaments that overlap each other, and as a result of those overlaps, it tends to be more difficult to reduce the delay time difference of the printed wiring board.

Further, in formula (1), the part "Bt/(25000/Wt)" reflects the occurrence frequency of gaps in the warp yarn, or, of overlaps in the warp yarn. The more that "Bt/(25000/Wt)" exceeds 1.000 and the larger, the greater the number of overlaps among the ends of the warp yarn, and as a result of those overlaps, it tends to be more difficult to reduce the delay time difference of the printed wiring board. On the other hand, the more that "Bt/(25000/Wt)" is less than 1.000 and the smaller, the greater the number of gaps in the warp yarn, and as a result of those gaps, it tends to be more difficult to reduce the delay time difference of the printed wiring board.

Further, in formula (1), regarding the part "(Dt×Ft)/(25000/Wt)", as stated above, it is preferred that the part "Bt/(Dt×Ft)" and "Bt/(25000/Wt)" are both close to 1.000. When the part "Bt/(Dt×Ft)" and "Bt/(25000/Wt)" are both close to 1.000, a function of bringing the value of formula (1) closer to 1.000 is achieved. Therefore, formula (1) reflects this trend, and indicates the possibility of a reduction in the delay time difference of the printed wiring board due to gaps or overlaps between the filaments constituting the warp yarn, or gaps or overlaps in the warp yarn.

Further, in the glass cloth of this embodiment, if the weft yarn fiber-opening efficiency coefficient Py is less than 0.600 or more than 1.500, it is difficult to reduce the delay time difference of the printed wiring board. The weft yarn fiber-opening efficiency coefficient Py is calculated from the Dy, Fy, Wy, and By using formula (2).

The weft yarn fiber-opening efficiency coefficient Py is preferably in the range of 0.770 or more and 1.200 or less, more preferably in the range of 0.800 or more and 1.100 or less, further preferably in the range of 0.890 or more and 1.000 or less, and particularly preferably in the range of 0.925 or more and 0.970 or less.

Here, similar to formula (1), formula (2) indicates the possibility of a reduction in the delay time difference of the printed wiring board due to gaps or overlaps between the filaments constituting the weft yarn, or gaps or overlaps in the weft yarn.

Further, formula (3) reflects the above-described characteristics of formula (1) and formula (2), and indicates the possibility of a reduction in the delay time difference of the printed wiring board due to gaps or overlaps between the filaments, or gaps or overlaps in the yarns, in the whole glass cloth.

Further, in the glass cloth of this embodiment, if Rt and Ry are each independently less than 68.6, it is difficult to increase productivity of the glass cloth while reducing the delay time difference of the printed wiring board and making the glass cloth thinner.

On the other hand, if Rt and Ry are each independently more than 555.5, it is difficult to stabilize the warp yarn width or weft yarn width, and it is difficult to reduce the delay time difference of the printed wiring boards caused by gaps in the warp yarn or in the weft yarn that occur due to variation in the yarn width.

Rt is the ratio (Ft/Dt) of the filament number Ft of the glass filaments constituting the warp yarn to the filament diameter Dt of the glass filaments constituting the warp yarn. Further, Ry is the ratio (Fy/Dy) of the filament number Fy of the glass filaments constituting the weft yarn to the filament diameter Dy of the glass filaments constituting the weft yarn.

Rt and Ry are each independently preferably in the range of 115.5 or more and 277.2 or less.

Further, the ratio Rt/Ry of Rt to Ry is, for example, in the range of 0.90 or more and 1.10 or less, preferably in the range of 0.95 or more and 1.05 or less, more preferably in the range of 0.97 or more to 1.03 or less, further preferably in the range of 0.98 or more and 1.02 or less, particularly preferably in the range of 0.99 or more and 1.01 or less, and most preferably is 1.00.

Further, in the glass cloth of this embodiment, Pt and Py preferably satisfy the following formula (3-1), more preferably satisfy the following formula (3-2), and further preferably satisfy the following formula (3-3):

$$0.800 \le (Pt \times Py)^{1/2} \le 1.100 \qquad (3\text{-}1)$$

$$0.890 \le (Pt \times Py)^{1/2} \le 0.970 \qquad (3\text{-}2)$$

$$0.900 \le (Pt \times Py)^{1/2} \le 0.952. \qquad (3\text{-}3)$$

Further, the ratio Pt/Py of Pt to Py is, for example, in the range of 0.80 or more and 1.20 or less, preferably in the range of 0.85 or more and 1.15 or less, more preferably in the range of 0.90 or more and 1.10 or less, further preferably in the range of 0.93 or more and 1.07 or less, particularly preferably in the range of 0.95 or more and 1.05 or less, especially preferably in the range of 0.96 or more and 1.04 or less, and most preferably in the range of 0.97 or more and 1.03 or less.

Further, in the glass cloth of this embodiment, the tex number (number of grams by mass per 1 km) of the warp yarn and the weft yarn is, for example, each independently in the range of 3.0 to 50.0 tex (g/km), more preferably in the range of 3.5 to 25.0 tex (g/km), and further preferably in the range of 4.0 to 18.0 tex (g/km).

In the glass cloth of this embodiment, the warp yarn and weft yarn may be twisted. In this case, the number of twists of the warp yarn or the number of twists of the weft yarn is each independently, for example, in the range of 1.00 twists/25 mm or less, preferably in the range of 0.70 twists/25 mm or less, more preferably in the range of 0.50 twists/25 mm or less, further preferably in the range of 0.40 twists/25 mm or less, particularly preferably in the range of 0.20 twists/25 mm or less, especially preferably in the range of 0.09 twists/25 mm or less, and most preferably is 0.00 twists/25 mm. As used herein, the number of twists of the warp yarn and weft yarn can be determined by using a twisting machine in accordance with JIS R 3912:2000 to calculate the number of turns required for untwisting of a test piece and the length under standard tension before the untwisting of the test piece.

By having the above-described configuration, the glass cloth of this embodiment has a thickness of less than 10.0 µm, preferably 9.4 µm or less, more preferably 9.0 µm or less, and further preferably 8.5 µm or less. The lower limit of the thickness of the glass cloth in this embodiment is, for example, 2.0 µm.

The mass per unit area of the glass cloth of this embodiment is, for example, in the range of 5.0 to 30.0 g/m², preferably in the range of 6.0 to 24.0 g/m², more preferably in the range of 7.0 to 21.0 g/m², and particularly preferably in the range of 8.0 to 16.0 g/m². Here, the mass per unit area of the glass cloth is determined by measuring the mass of the glass cloth cut into a size of 200 mm×200 mm at three points using a scale based on JIS R 3420:2013, and taking the average value of each of those three values converted into mass per 1 m².

In the glass cloth of this embodiment, the ratio of the mass per unit area of the glass cloth to the thickness of the glass cloth (mass per unit area of the glass cloth/thickness of the glass cloth) is, for example, in the range of 1.20 to 3.60, preferably in the range of 1.25 to 2.50, and more preferably in the range of 1.30 to 1.95.

Further, in the glass cloth of this embodiment, it is preferred that the filament diameter Dt of the glass filaments constituting the warp yarn and the filament diameter Dy of the glass filaments constituting the weft yarn are each independently in the range of 2.0 µm or more and 3.8 µm or less, and that Pt and Py satisfy the following formula (4):

$$0.890 \le (Pt \times Py)^{1/2} \le 0.970. \quad (4)$$

The filament diameter of the warp yarn and weft yarn is the average value of the measured values when measuring the diameter of the glass filaments constituting the warp yarn or weft yarn at 50 points on a cross section of the warp yarn or weft yarn, respectively, using a scanning electron microscope (manufactured by Hitachi High-Tech Corporation, trade name: S-3400N, magnification: 3000×). Further, the number of glass filaments constituting the warp yarn or the weft yarn is the average value of the measured values when measuring the number of glass filaments constituting the warp yarn or weft yarn at 50 points on a cross section of each of the warp yarn or weft yarn using a scanning electron microscope (manufactured by Hitachi High-Tech Corporation, trade name: S-3400N, magnification: 500×).

Further, the weaving density of the warp yarn can be determined by counting the filament number of the warp yarn in a range of 25 mm in the weft direction using a textile magnification glass in accordance with JIS R 3420. Further, the weaving density of the weft yarn can be determined by counting the filament number of the weft yarn in a range of 25 mm in the warp direction using a textile magnification glass in accordance with JIS R 3420.

Further, the average yarn width of the warp yarn and weft yarn is determined by cutting three 100 mm×100 mm samples from positions spaced apart from each other on the glass cloth, and taking the average value of 10 filaments of the warp yarn or weft yarn, respectively, of each sample when measured using a microscope (manufactured by KEYENCE CORPORATION, trade name: VHX-6000, magnification: 200 times).

Further, the thickness of the glass cloth is the average value of the thickness measured using a micrometer at 15 points in the glass cloth in accordance with JIS R 3420:2013.

The glass filaments can be obtained by melting and fiberizing a predetermined glass batch (glass raw material). For example, a glass batch having a composition such as an E-glass fiber (general purpose glass fiber) composition, a high-strength glass fiber composition, or a low dielectric constant glass fiber composition can be used.

Here, the E-glass fiber composition contains from 52 to 56% by mass of $SiO_2$, from 5 to 10% by mass of $B_2O_3$, from 12 to 16% by mass of $Al_2O_3$, a total of from 20 to 25% by mass of CaO and MgO, and a total of from 0 to 1% by mass of $Na_2O$, $K_2O$, and $Li_2O$.

Further, the high-strength glass fiber composition contains from 57 to 70% by mass of $SiO_2$, from 18 to 30% by mass of $Al_2O_3$, from 0 to 13% by mass of CaO, from 5 to 15% by mass of MgO, a total of from 0 to 1% by mass of $Na_2O$, $K_2O$, and $Li_2O$, from 0 to 1% by mass of $TiO_2$, and from 0 to 2% by mass of $B_2O_3$.

Further, the low dielectric constant glass fiber composition contains from 48 to 62% by mass of $SiO_2$, from 17 to 26% by mass of $B_2O_3$, from 9 to 18% by mass of $Al_2O_3$, from 0.1 to 9% by mass of CaO, from 0 to 6% by mass of MgO, a total of from 0.05 to 0.5% by mass of $Na_2O$, $K_2O$, and $Li_2O$, from 0 to 5% by mass of $TiO_2$, from 0 to 6% by mass of SrO, a total of from 0 to 3% by mass of $F_2$ and $Cl_2$, and from 0 to 6% by mass of $P_2O_5$.

From the viewpoint of versatility, the glass filaments are preferably the above-described E-glass fiber composition, from the viewpoint of suppressing warping when made into a prepreg, are preferably the above-described high-strength glass fiber composition. In that case, it is more preferred that the high-strength glass fiber composition contain from 64 to 66% by mass of $SiO_2$, from 24 to 26% by mass of $Al_2O_3$, and from 9 to 11% by mass of MgO, and that the total of $SiO_2$, $Al_2O_3$, and MgO be 99% by mass or more.

About from 150 to 3000 of the glass filaments are bundled together in a known manner, wound onto a winding tube, or unwound from the winding tube and further wound onto a bobbin. Bundled-together glass filaments (glass strands) that have been wound onto a winding tube are sometimes referred to as a "cake". Further, bundled-together glass filaments that have been wound onto a bobbin are sometimes referred to as a "glass yarn package".

Here, the glass filaments usually have a circular cross-sectional shape, but may have a flattened cross-sectional shape such as an ellipse or an oval. When the glass filaments have a flattened cross-sectional shape, the ratio of major axis/minor axis is, for example, in the range of 1.1 to 10.0. Further, when the glass filaments have a flattened cross-sectional shape, the filament diameter is the diameter of a circle having the same area as the flattened cross-sectional shape. It is noted that when the glass filaments have a circular cross-sectional shape, the ratio of major axis/minor axis is 1.0.

The warp yarn and weft yarn to be used in the glass cloth of this embodiment can be obtained by drawing out the glass strand from the cake or drawing out the glass yarn from the glass yarn package, adjusting the number of twists of the glass strand or the glass yarn package as necessary, and performing a yarn fiber-opening treatment.

The number of twists of the glass strand or the glass yarn package is adjusted so that the fibers of the glass strand or the glass yarn package can be easily opened in the yarn fiber-opening treatment. The number of twists of the glass strand or the glass yarn package is adjusted to, for example, 1.0 twists/25 mm or less, preferably adjusted to 0.7 twists/25 mm or less, and more preferably adjusted to 0.2 twists/25 mm or less. The adjustment of the number of twists of the glass strand or the glass yarn package can be performed using an untwisting machine or a twisting machine.

Examples of the yarn fiber-opening treatment include opening the fibers by water pressure, opening the fibers by high frequency vibrations such as ultrasonic waves using a liquid as a medium, opening the fibers by the pressure of a fluid having surface pressure, opening the fibers by the pressure from a roll, and the like.

The glass cloth of this embodiment can be obtained by using a known loom to weave the warp yarn and the weft yarn, and then performing yarn fiber-opening treatment. Examples of the loom include a jet loom such as an air jet or water jet, a shuttle loom, a rapier looms, and the like. Examples of weaving methods using a loom include plain weave, satin weave, nanako weave (a traditional Japanese weave), twill weave, and the like.

Examples of the fiber-opening treatment include opening the fibers by water pressure, opening the fibers by high frequency vibrations such as ultrasonic waves using a liquid as a medium, opening the fibers by the pressure of a fluid having surface pressure, opening the fibers by the pressure from a roll, and the like. Among these types of fiber-opening treatment, it is preferred to use fiber-opening treatment by water flow pressure or fiber-opening treatment by high frequency vibrations such as ultrasonic waves using a liquid as a medium because variation in the yarn width in each of the warp yarn and weft yarn after the fiber-opening treatment is reduced. Further, by using a plurality of fiber-opening treatment methods in combination, the occurrence of defects in the appearance of the glass cloth, such as curved bowing, caused by the fiber-opening treatment can be suppressed.

The surface of the glass cloth of this embodiment may be subjected to a surface treatment in which a treatment liquid containing a silane coupling agent is adhered to the surface. Here, the surface treatment can be performed by, for example, applying the treatment liquid containing a silane coupling agent and drying by a method known per se.

Examples of the silane coupling agent include an aminosilane, a chlorosilane, an epoxysilane, a mercaptosilane, a vinylsilane, and a (meth)acrylicsilane. In the glass cloth of this embodiment, the silane coupling agent may be used alone, or two or more types may be used in combination.

Examples of the aminosilane include γ-aminopropyltriethoxysilane, N-β-(aminoethyl)-γ-aminopropyltrimethoxysilane, N-β-(aminoethyl)-N'-β-(aminoethyl)-γ-aminopropyltrimethoxysilane, γ-anilinopropyltrimethoxysilane, and the like.

Examples of the chlorosilane include γ-chloropropyltrimethoxysilane and the like.

Examples of the epoxysilane include β-(3,4-epoxycyclohexyl)ethyltrimethoxysilane, γ-glycidoxypropyltrimethoxysilane, and the like.

Examples of the mercaptosilane include γ-mercaptotrimethoxysilane and the like.

Examples of the vinylsilane include vinyltrimethoxysilane, N-β-(N-vinylbenzylaminoethyl)-γ-aminopropyltrimethoxysilane, and the like.

Examples of the (meth)acrylic silane include γ-methacryloxypropyltrimethoxysilane and the like.

Further, the treatment liquid containing the silane coupling agent may contain, for example, a surfactant and a pH adjuster in addition to the silane coupling agent.

Examples of the surfactant include a nonionic surfactants, a cationic surfactant, an anionic surfactant, and an amphoteric surfactant. In the glass cloth of this embodiment, the surfactant may be used alone, or two or more types may be used in combination.

Examples of the nonionic surfactant include an ethylene oxide propylene oxide alkyl ether, a polyoxyethylene alkyl ether, a polyoxyethylene-polyoxypropylene-block copolymer, an alkylpolyoxyethylene-polyoxypropylene-block copolymer ether, a polyoxyethylene fatty acid ester, a polyoxyethylene fatty acid monoester, a polyoxyethylene fatty acid diester, a polyoxyethylene sorbitan fatty acid ester, a glycerol fatty acid ester ethylene oxide adduct, a polyoxyethylene castor oil ether, a hydrogenated castor oil ethylene oxide adduct, an alkylamine ethylene oxide adduct, a fatty acid amide ethylene oxide adduct, a glycerol fatty acid ester, a polyglycerin fatty acid ester, a pentaerythritol fatty acid ester, a sorbitol fatty acid ester, a sorbitan fatty acid ester, a sucrose fatty acid ester, a polyhydric alcohol alkyl ether, a fatty acid alkanolamide, an acetylene glycol, an acetylene alcohol, an ethylene oxide adduct of an acetylene glycol, and an ethylene oxide adduct of an acetylene alcohol.

Examples of the cationic surfactant include alkyldimethylbenzylammonium chloride, alkyltrimethylammonium chloride, alkyldimethylethylammonium ethyl sulfate, a higher alkylamine salt, an ethylene oxide adduct of a higher alkylamine, a condensate of a higher fatty acid and a polyalkylene polyamine, a salt of an ester of a higher fatty acid and an alkanolamine, a salt of a higher fatty acid amide, an imidazoline type cationic surfactant, and an alkylpyridinium salt. Examples of the higher alkylamine salt include an acetate and a hydrochloride.

Examples of the anionic surfactant include a higher alcohol sulfate salt, a higher alkyl ether sulfate salt, an α-olefin sulfate salt, an alkylbenzene sulfonate, an α-olefin sulfonate, a reaction product of a fatty acid halide and N-methyltaurine, a sulfosuccinic acid dialkyl ester salt, a higher alcohol phosphate ester salt, and a phosphate ester salt of a higher alcohol ethylene oxide adduct.

Examples of the amphoteric surfactant include an amino acid type amphoteric surfactant such as an alkylaminopropionic acid alkali metal salt, a betaine type amphoteric surfactant such as alkyl dimethyl betaine, and an imidazoline type amphoteric surfactant.

Examples of the pH adjuster include acetic acid, formic acid, and propionic acid.

When the glass cloth of this embodiment has been surface-treated and has an organic substance adhered thereto, the amount of the adhered organic substance is, for example, in the range of 0.05 to 5.00 parts by mass with respect to 100 parts by mass of the glass cloth to which the organic substance is adhered. Here, the ratio of the mass of the organic substance to the mass of the glass cloth to which the organic matter is adhered can be determined by measuring the mass of a test piece before and after heat drying, in accordance with JIS R 3420:2013. It is noted that when the mass of the glass cloth decreases due to heat drying, the amount of adhered organic matter is measured in consideration of the amount of this decrease.

The prepreg of this embodiment includes the above-described glass cloth of this embodiment.

The prepreg of this embodiment can be obtained by impregnating the above-described glass cloth with a resin and semi-curing by a method known per se.

In the prepreg of this embodiment, the resin that is impregnated into the glass cloth is not particularly limited. Examples of the resin include a thermosetting resin, such as an epoxy resin, a phenol resin, an unsaturated polyester resin, a melamine resin, a modified polyimide resin, a maleimide resin, a thermosetting polyphenylene ether resin, and a thermosetting modified polyphenylene ether resin. Further examples of the resin include a thermoplastic resin, such as a polyamide resin, a polyimide resin, a polybutylene terephthalate resin, a polyethylene terephthalate resin, a polyphenylene sulfide resin, a polyphenylene ether resin, a thermoplastic modified polyphenylene ether resin, a fluororesin, a liquid crystal polyester (LCP), and a cycloolefin resin.

Further, the printed wiring board of this embodiment is formed from a prepreg containing the glass cloth of this embodiment.

In addition to a printed wiring board, the glass cloth of this embodiment can be suitably used for an electronic device casing, a fuel cell separator, and the like.

Next, examples and comparative examples of the present invention will be described.

EXAMPLES

Reference Example 1

In this reference example, first, glass filaments having an E-glass fiber composition were spun to obtain a glass yarn to serve as a warp yarn and weft yarn. The warp yarn and the weft yarn were formed by bundling, as the filament number (Ft, Fy), 38 glass filaments each having a filament diameter (Dt, Dy) of 3.6 μm, and had a mass of 0.99 tex (g/km).

Next, the warp yarn and the weft yarn were woven using a rapier loom to obtain a plain weave glass cloth having a weaving density (Wt) of the warp yarn of 105 filaments/25 mm and a weaving density (Wy) of the weft yarn of 110 filaments/25 mm. Next, the plain weave glass cloth was subjected to a degreasing treatment, a surface treatment, and a fiber-opening treatment.

The degreasing treatment was performed by placing the plain weave glass cloth in a heating furnace having an ambient temperature of from 350° C. to 400° C. for 60 hours to thermally decompose the spinning bundling agent and the weaving bundling agent adhered to the plain weave glass cloth. Further, the surface treatment was performed by applying methacrylic silane was applied to the plain weave glass cloth, and curing the cloth while continuously passing the cloth through a heating furnace at 130° C. In addition, in the fiber-opening treatment, a tension of 50 N was applied to the warp yarn of the plain weave glass cloth, and a fiber-opening treatment by water flow pressure was performed using a water flow pressure set at 1.0 MPa.

It is noted that the tension applied to the warp yarn of the plain weave glass cloth in the treatments other than the fiber-opening treatment was from 70 to 120 N, and in the fiber-opening treatment, a value of the tension detected by a tension detector was provided as feedback to a guide roller conveying the plain weave glass cloth, and the tension was adjusted by changing the position of the guide roller. As a result, the glass cloth shown in Table 2 was obtained.

Next, the glass cloth obtained in this reference example was immersed in an epoxy resin (manufactured by DIC Corporation, trade name: EPICLON 121N-80N) diluted with methyl ethyl ketone to impregnate the glass cloth with the resin, the cloth was passed through 13 μm-wide slit to remove excess resin, then held at a temperature of 150° C. for 1 minute in a dryer to semi-cure the glass cloth impregnated with the epoxy resin to prepare a prepreg.

Next, four sheets of the obtained prepreg were stacked, and then subjected to heat and pressure at 200° C. for 2 hours at 3 MPa to prepare an evaluation board A as a cured product of the prepreg.

Next, three sheets of the obtained prepreg were stacked, a copper foil (manufactured by Furukawa Electric Co., Ltd., trade name: FV-WS) was arranged on both sides of the stack, and then subjected to heat and pressure at 200° C. for 2 hours at 3 MPa to prepare an evaluation board B as a copper foil-clad laminate (metal-clad laminate) having a thickness of 200 μm with copper foil adhered to both sides.

Next, the metal foil (copper foil) on one side of evaluation board B was cut to form 10 wires having a width of from 100 to 300 μm, a length of 100 mm, and a spacing of 20 mm. A three-layer board was produced by again laminating the prepreg and the metal foil (copper foil) on the surface of evaluation board B on the side where the wiring was formed. The width of the wiring was adjusted so that the characteristic impedance of the circuit after producing the three-layer board would be 50Ω.

Next, the delay time of the three-layer board at 20 GHz was measured, and the difference between the maximum value and minimum value of the obtained delay times was calculated as the delay time difference.

If the delay time difference is large, deterioration in signal quality due to differential signal skew tends to occur, and if the delay time difference is small, deterioration in signal quality due to skew is less likely to occur. Therefore, the signal quality due to skew can be evaluated using the delay time difference as an index.

Example 1

In this example, first, glass filaments having an E-glass fiber composition were spun to obtain a glass yarn to serve as the warp yarn and weft yarn. The glass yarn was formed by bundling together 496 glass filaments having a filament diameter of 3.6 μm, and had a mass of 12.92 tex (g/km).

Next, the glass yarn wound onto a bobbin was drawn out from the bobbin while being twisted in the opposite direction to the twisting direction of the glass yarn, and fed out in an untwisted state, and placed in a water tank at 60° C. to open the fibers of the glass yarn by applying ultrasonic waves generated from an oscillator having a frequency of 100 kHz and an output of 1.2 kW. Next, a fiber-opened glass yarn package was obtained by winding the glass yarn whose fibers had been opened (fiber-opened glass yarn) onto a bobbin so that the fiber-opened direction of the glass yarn was parallel to the length direction of the bobbin.

The average yarn width of the fiber-opened glass yarn, which serves as the warp yarn and weft yarn, was 1700 μm. Here, the average yarn width of the fiber-opened glass yarn was calculated from the measured values of measuring the yarn width of the fiber-opened glass yarn at 30 locations every 10 cm using a microscope (manufactured by KEYENCE CORPORATION, trade name: VHX-6000).

Next, the fiber-opened glass yarn was drawn out as warp yarn or weft yarn from a plurality of fiber-opened glass yarn packages, and a plain weave glass cloth was woven with the warp yarn weaving density (Wt) set to 14.0 filaments/25 mm and a weft yarn weaving density (Wy) set to 14.0 filaments/25 mm using a rapier loom. Next, the plain weave glass cloth was subjected to a degreasing treatment, surface treatment, and fiber-opening treatment in exactly the same manner as in Reference Example 1. As a result, the glass cloth shown in Table 1 was obtained.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated as follows for reduction in delay time difference, glass cloth yarn width stability, and glass cloth productivity. The results are shown in Table 1.

[Reduction in Delay Time Difference]

Based on the delay time difference in Reference Example 1, cases where the delay time difference was 50% or less were evaluated as "A (excellent)", cases where the delay time difference was more than 50% and 90% or less were evaluated as "B (good)", and cases where the delay time difference was more than 90% were evaluated as "C (fair to Equivalent)".

[Glass Cloth Yarn Width Stability]

Three 100 mm×100 mm samples were cut from positions spaced apart from each other on the glass cloth, and the yarn width of 10 filaments of the warp yarn or weft yarn, respectively, from each sample was measured using a microscope (manufactured by KEYENCE CORPORATION, trade name: VHX-6000). From the obtained measured values, the average value and standard deviation of the warp yarn and weft yarn were calculated, and the coefficient of variation (standard deviation/average value) was calculated from the average value and standard deviation. Next, the average value (average coefficient of variation) of the coefficient of variation of the warp yarn and the coefficient of variation of the weft yarn was calculated. Cases where the average coefficient of variation was 0.10 or less were evaluated as "A", and cases where the average coefficient of variation was more than 0.10 were evaluated as "B".

[Glass Cloth Productivity]

Using a rapier loom, the time to weave 1000 m of glass cloth (1000 m weaving time) was measured. Based on the 1000 m weaving time of Reference Example 1, cases where the 1000 m weaving time was 30% or less of that weaving time were evaluated as "OK", and cases where the 1000 m weaving time was more than 30% of that weaving time were evaluated as "NG".

Example 2

In this example, first, glass filaments having an E-glass fiber composition were spun, and then as the glass yarn to serve as the warp yarn and the weft yarn, 334 glass filaments having a filament diameter of 3.6 μm were bundled together to obtain a glass yarn with a mass of 8.70 tex (g/km). Next, the glass cloth shown in Table 1 was obtained in exactly the same manner as in Example 1, except that a fiber-opened glass yarn having an average yarn width of 1081 μm obtained by opening the fibers of the glass yarn was used, and the warp yarn weaving density (Wt) was 20.8 filaments/25 mm and the weft yarn weaving density (Wy) was 20.8 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated in exactly the same manner as in Example 1 for reduction in delay time difference, glass cloth yarn width stability, and glass cloth productivity. The results are shown in Table 1.

Example 3

In this example, first, glass filaments having an E-glass fiber composition were spun, and then as the glass yarn to serve as the warp yarn and the weft yarn, 360 glass filaments having a filament diameter of 2.6 μm were bundled together to obtain a glass yarn with a mass of 4.89 tex (g/km). Next, the glass cloth shown in Table 1 was obtained in exactly the same manner as in Example 1, except that a fiber-opened glass yarn having an average yarn width of 925 μm obtained by opening the fibers of the glass yarn was used, and the warp yarn weaving density (Wt) was 26.0 filaments/25 mm and the weft yarn weaving density (Wy) was 26.0 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated in exactly the same manner as in Example 1 for reduction in delay time difference, glass cloth yarn width stability, and glass cloth productivity. The results are shown in Table 1.

Example 4

In this example, first, glass filaments having an E-glass fiber composition were spun, and then as the glass yarn to serve as the warp yarn and the weft yarn, 1500 glass filaments having a filament diameter of 3.6 μm were bundled together to obtain a glass yarn with a mass of 39.08 tex (g/km). Next, the glass cloth shown in Table 1 was obtained in exactly the same manner as in Example 1, except that a fiber-opened glass yarn having an average yarn width of 5260 μm obtained by opening the fibers of the glass yarn was used, and the warp yarn weaving density (Wt) was 4.7 filaments/25 mm and the weft yarn weaving density (Wy) was 4.7 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated in exactly the same manner as in Example 1 for reduction in delay time difference, glass cloth yarn width stability, and glass cloth productivity. The results are shown in Table 1.

Example 5

In this example, first, glass filaments having an E-glass fiber composition were spun, and then as the glass yarn to serve as the warp yarn and the weft yarn, 496 glass filaments having a filament diameter of 3.6 μm were bundled together to obtain a glass yarn with a mass of 12.92 tex (g/km). Next, the glass cloth shown in Table 1 was obtained in exactly the same manner as in Example 1, except that a fiber-opened glass yarn having an average yarn width of 2230 μm obtained by opening the fibers of the glass yarn in exactly the same manner as in Example 1 except that an oscillator having a frequency of 100 kHz and an output of 1.6 kW was used, and the warp yarn weaving density (Wt) was 14.0 filaments/25 mm and the weft yarn weaving density (Wy) was 14.0 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated in exactly the same manner as in Example 1 for reduction in delay time difference, glass cloth yarn width stability, and glass cloth productivity. The results are shown in Table 1.

Example 6

In this example, first, glass filaments having an E-glass fiber composition were spun, and then as the glass yarn to serve as the warp yarn and the weft yarn, 550 glass filaments having a filament diameter of 4.0 μm were bundled together to obtain a glass yarn with a mass of 17.69 tex (g/km). Next, the glass cloth shown in Table 1 was obtained in exactly the same manner as in Example 1, except that a fiber-opened glass yarn having an average yarn width of 2120 μm obtained by opening the fibers of the glass yarn was used, and the warp yarn weaving density (Wt) was 11.3 filaments/25 mm and the weft yarn weaving density (Wy) was 11.3 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this example was used, and the delay time difference of the three-layer board was calculated.

Next, the glass cloth of this example was evaluated in exactly the same manner as in Example 1 for reduction in delay time difference, glass cloth yarn width stability, and glass cloth productivity. The results are shown in Table 1.

Comparative Example 1

In this comparative example, first, glass filaments having an E-glass fiber composition were spun, and then as the glass yarn to serve as the warp yarn and the weft yarn, 496 glass filaments having a filament diameter of 3.6 μm were bundled together to obtain a glass yarn with a mass of 12.92 tex (g/km). Next, the glass cloth shown in Table 2 was obtained in exactly the same manner as in Example 1, except that a fiber-opened glass yarn having an average yarn width of 891 μm obtained by opening the fibers of the glass yarn in exactly the same manner as in Example 1 except that an oscillator having a frequency of 100 kHz and an output of 0.6 kW was used, and the warp yarn weaving density (Wt) was 28.0 filaments/25 mm and the weft yarn weaving density (Wy) was 28.0 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this comparative example was used, and the delay time difference of the three-layer board was calculated.

Next, the glass cloth of this comparative example was evaluated in exactly the same manner as in Example 1 for reduction in delay time difference, glass cloth yarn width stability, and glass cloth productivity. The results are shown in Table 2.

Comparative Example 2

In this comparative example, first, glass filaments having an E-glass fiber composition were spun, and then as the glass yarn to serve as the warp yarn and the weft yarn, 496 glass filaments having a filament diameter of 3.6 μm were bundled together to obtain a glass yarn with a mass of 12.92 tex (g/km). Next, the glass cloth shown in Table 2 was obtained in exactly the same manner as in Example 1, except that a fiber-opened glass yarn having an average yarn width of 1158 μm obtained by opening the fibers of the glass yarn in exactly the same manner as in Example 1 except that an oscillator having a frequency of 100 kHz and an output of 0.8 kW was used, and the warp yarn weaving density (Wt) was 14.0 filaments/25 mm and the weft yarn weaving density (Wy) was 14.0 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this comparative example was used, and the delay time difference of the three-layer board was calculated.

Next, the glass cloth of this comparative example was evaluated in exactly the same manner as in Example 1 for reduction in delay time difference, glass cloth yarn width stability, and glass cloth productivity. The results are shown in Table 2.

Comparative Example 3

In this comparative example, first, glass filaments having an E-glass fiber composition were spun, and then as the glass yarn to serve as the warp yarn and the weft yarn, 2500 glass filaments having a filament diameter of 3.6 μm were bundled together to obtain a glass yarn with a mass of 65.13 tex (g/km). Next, the glass cloth shown in Table 2 was obtained in exactly the same manner as in Example 1, except that a fiber-opened glass yarn having an average yarn width of 8760 μm obtained by opening the fibers of the glass yarn was used, and the warp yarn weaving density (Wt) was 2.8 filaments/25 mm and the weft yarn weaving density (Wy) was 2.8 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this comparative example was used, and the delay time difference of the three-layer board was calculated.

Next, the glass cloth of this comparative example was evaluated in exactly the same manner as in Example 1 for reduction in delay time difference, glass cloth yarn width stability, and glass cloth productivity. The results are shown in Table 2.

Comparative Example 4

In this comparative example, first, glass filaments having an E-glass fiber composition were spun, and then as the glass yarn to serve as the warp yarn and the weft yarn, 160 glass filaments having a filament diameter of 3.6 μm were bundled together to obtain a glass yarn with a mass of 4.17 tex (g/km). Next, the glass cloth shown in Table 2 was obtained in exactly the same manner as in Example 1, except that a fiber-opened glass yarn having an average yarn width of 550 μm obtained by opening the fibers of the glass yarn was used, and the warp yarn weaving density (Wt) was 43.4 filaments/25 mm and the weft yarn weaving density (Wy) was 43.4 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this comparative example was used, and the delay time difference of the three-layer board was calculated.

Next, the glass cloth of this comparative example was evaluated in exactly the same manner as in Example 1 for reduction in delay time difference, glass cloth yarn width stability, and glass cloth productivity. The results are shown in Table 2.

Comparative Example 5

In this comparative example, first, glass filaments having an E-glass fiber composition were spun, and then as the glass yarn to serve as the warp yarn and the weft yarn, 689 glass filaments having a filament diameter of 5.0 μm were bundled together to obtain a glass yarn with a mass of 34.63 tex (g/km). Next, the glass cloth shown in Table 2 was obtained in exactly the same manner as in Example 1, except that a fiber-opened glass yarn having an average yarn width of 3250 μm obtained by opening the fibers of the glass yarn was used, and the warp yarn weaving density (Wt) was 7.3 filaments/25 mm and the weft yarn weaving density (Wy) was 7.3 filaments/25 mm.

Next, a three-layer board consisting of a prepreg, an evaluation board A as a cured product of the prepreg, and an evaluation board B as a copper foil-clad laminate (metal-clad laminate) was prepared in exactly the same manner as in Reference Example 1 except that the glass cloth of this comparative example was used, and the delay time difference of the three-layer board was calculated.

Next, the glass cloth of this comparative example was evaluated in exactly the same manner as in Example 1 for reduction in delay time difference, glass cloth yarn width stability, and glass cloth productivity. The results are shown in Table 2.

TABLE 1

|  | Example 1 | Example 2 | Example 3 | Example 4 | Example 5 | Example 6 |
|---|---|---|---|---|---|---|
| Warp yarn filament diameter (μm); Dt | 3.6 | 3.6 | 2.6 | 3.6 | 3.6 | 4.0 |
| Filament number of warp yarn; Ft | 496 | 334 | 360 | 1500 | 496 | 550 |
| Warp yarn weaving density (filaments/25 mm); Wt | 14.0 | 20.8 | 26.0 | 4.7 | 11.0 | 11.3 |
| Average yarn width of warp yarn (μm); Bt | 1690 | 1080 | 920 | 5250 | 2200 | 2100 |
| Filament number of warp yarn/filament diameter Rt | 137.8 | 92.8 | 138.5 | 416.7 | 137.8 | 137.5 |
| Warp yarn fiber-opening efficiency coefficient; Pt | 0.946 | 0.899 | 0.944 | 0.994 | 0.858 | 0.947 |
| Weft yarn filament diameter (μm); Dy | 3.6 | 3.6 | 2.6 | 3.6 | 3.6 | 4.0 |
| Filament number of weft yarn (filaments); Fy | 496 | 334 | 360 | 1500 | 496 | 550 |
| Weft yarn weaving density (filaments/25 mm); Wy | 14.0 | 20.8 | 26.0 | 4.7 | 11.0 | 11.3 |
| Average yarn width of weft yarn(μm); By | 1710 | 1083 | 930 | 5270 | 2250 | 2130 |
| Filament number of weft yarn/Weft yarn filament diameter; Ry | 137.8 | 92.8 | 138.5 | 416.7 | 137.8 | 137.5 |
| Weft yarn fiber-opening efficiency coefficient; Py | 0.958 | 0.901 | 0.954 | 0.998 | 0.878 | 0.960 |
| $(Pt \times Py)^{1/2}$ | 0.952 | 0.900 | 0.949 | 0.996 | 0.868 | 0.953 |
| Glass cloth thickness (μm) | 8.0 | 8.0 | 5.7 | 8.4 | 8.0 | 9.2 |
| Reduction in delay time difference | A | A | A | A | B | A |
| Stability of glass cloth yarn width | A | A | A | B | A | A |
| Glass cloth productivity | OK | OK | OK | OK | OK | OK |

Pt; $\{(Bt/(Dt \times Ft)) \times Bt/(25000/Wt)\}^{1/2} \times (Dt \times Ft)/(25000/Wt)\}$
Py; $\{(By/(Dy \times Fy)) \times By/(25000/Wy)\}^{1/2} \times (Dy \times Fy)/(25000/Wy)\}$

TABLE 2

|  | Comparative Example 1 | Comparative Example 2 | Comparative Example 3 | Comparative Example 4 | Comparative Example 5 | Reference Example 1 |
|---|---|---|---|---|---|---|
| Warp yarn filament diameter (μm); Dt | 3.6 | 3.6 | 3.6 | 3.6 | 5.0 | 3.6 |
| Filament number of warp yarn; Ft | 496 | 496 | 2500 | 160 | 689 | 38 |
| Warp yarn weaving density (filaments/25 mm); Wt | 28.0 | 14.0 | 2.8 | 43.4 | 7.3 | 105 |
| Average yarn width of warp yarn (μm); Bt | 890 | 1155 | 8750 | 540 | 3250 | 137 |
| Filament number of warp yarn/filament diameter; Rt | 137.8 | 137.8 | 694.4 | 44.4 | 137.8 | 10.6 |
| Warp yarn fiber-opening efficiency coefficient; Pt | 1.410 | 0.647 | 0.984 | 0.937 | 0.952 | 0.436 |
| Weft yarn filament diameter (μm); Dy | 3.6 | 3.6 | 3.6 | 3.6 | 5.0 | 3.6 |
| Filament number of weft yarn (filaments); Fy | 496 | 496 | 2500 | 160 | 689 | 38 |
| Weft yarn weaving density (filaments/25 mm); Wy | 28.0 | 14.0 | 2.8 | 43.4 | 7.3 | 110 |
| Average yarn width of weft yarn (μm); By | 892 | 1160 | 8760 | 560 | 3250 | 185 |
| Filament number of weft yarn/Weft yarn filament diameter; Ry | 137.8 | 137.8 | 694.4 | 44.4 | 137.8 | 10.6 |
| Weft yarn fiber-opening efficiency coefficient; Py | 1.413 | 0.650 | 0.985 | 0.972 | 0.952 | 0.632 |
| $(Pt \times Py)^{1/2}$ | 1.411 | 0.648 | 0.984 | 0.955 | 0.952 | 0.525 |
| Glass cloth thickness (μm) | 9.5 | 8.0 | 9.5 | 8.0 | 13.5 | 10.0 |
| Reduction in delay time difference | C | C | C | A | A | C |
| Stability of glass cloth yarn width | A | A | B | A | A | — |
| Glass cloth productivity | OK | OK | OK | NG | OK | — |

Pt; $\{(Bt/(Dt \times Ft)) \times Bt/(25000/Wt)\}^{1/2} \times (Dt \times Ft)/(25000/Wt)\}$
Py; $\{(By/(Dy \times Fy)) \times By/(25000/Wy)\}^{1/2} \times (Dy \times Fy)/(25000/Wy)\}$ From Table 1, it can be seen that the glass cloths of Examples 1 to 6 according to the present invention had a stable yarn width of the warp yarn and weft yarn, a reduced delay time difference of the printed wiring board, deterioration in signal quality could be suppressed, and high productivity could be achieved.

On the other hand, from Table 2, it can be seen that for the glass cloths of Comparative Examples 1 and 2, in which the warp yarn fiber-opening efficiency coefficient Pt and the weft yarn fiber-opening efficiency coefficient Py did not satisfy the above formula (3), the reduction in the delay time difference was evaluated as being from fair to equivalent with respect to that for the glass cloth of Reference Example 1.

Further, for the glass cloth of Comparative Example 3, in which Rt and Ry were more than 555.5, it can be seen that the reduction in the delay time difference was from fair to equivalent with respect to that of the glass cloth of Reference Example 1, and that the glass cloth yarn width stability was poor.

In addition, for the glass cloth of Comparative Example 4, in which Rt and Ry were less than 68.6, it can be seen that there was a problem with the glass cloth productivity.

Moreover, for the glass cloth of Comparative Example 5, in which the filament diameter Dt of the glass filaments constituting the warp yarn and the filament diameter Dy of the glass filaments constituting the weft yarn was more than 4.5 μm, it can be seen that the thickness was more than 10.0 μm.

The invention claimed is:
1. A glass cloth composed of a warp yarn and a weft yarn, each of which is formed by bundling together a plurality of glass filaments, wherein
a filament diameter Dt of the glass filaments constituting the warp yarn and a filament diameter Dy of the glass filaments constituting the weft yarn are each independently in a range of 0.5 μm or more and 4.5 μm or less,
a filament number Ft of the glass filaments constituting the warp yarn and a filament number Fy of the glass filaments constituting the weft yarn are each independently in a range of 150 or more and 3000 or less, a weaving density Wt of the warp yarn and a weaving density Wy of the weft yarn are each independently in a range of 1.0 filaments/25 mm or more and 50.0 filaments/25 mm or less, an average yarn width Bt of the warp yarn and an average yarn width By of the weft yarn are each independently in a range of 550 μm or more and 10000 μm or less, a warp yarn fiber-opening efficiency coefficient Pt determined from the Dt, Ft, Wt, and Bt using a following formula (1) is in a range of 0.600 or more and 1.500 or less, and a weft yarn fiber-opening efficiency coefficient Py determined from the Dy, Fy, Wy, and By using a following formula (2) is in a range of 0.600 or more and 1.500 or less, Rt, which is a ratio (Ft/Dt) of the filament number Ft of the glass filaments constituting the warp yarn to the filament diameter Dt of the glass filaments constituting the warp yarn, and Ry, which is a ratio (Fy/Dy) of the filament number Fy of the glass filaments constituting the weft yarn to the filament diameter Dy of the glass filaments constituting the weft yarn, are each independently in a range of 68.6 or more and 555.5 or less, the Pt and Py satisfy a following formula (3), and the glass cloth has a thickness of less than 10.0 μm:

$$Pt = \{(Bt/(Dt \times Ft)) \times Bt/(25000/Wt)\}^{1/2} \times \{(Dt \times Ft)/(25000/Wt)\} \quad (1)$$

$$Py = \{(By/(Dy \times Fy)) \times By/(25000/Wy)\}^{1/2} \times \{(Dy \times Fy)/(25000/Wy)\} \quad (2)$$

$$0.770 \leq (Pt \times Py)^{1/2} \leq 1.200. \quad (3)$$

2. The glass cloth according to claim 1, wherein the filament diameter Dt of the glass filaments constituting the warp yarn and the filament diameter Dy of the glass filaments constituting the weft yarn are each independently 2.0 μm or more and 3.8 μm or less, and the Pt and Py satisfy a following formula (4):

$$0.890 \leq (Pt \times Py)^{1/2} \leq 0.970. \quad (4)$$

3. A prepreg comprising the glass cloth according to claim 1.

4. A printed wiring board comprising the glass cloth according to claim 1.

5. A prepreg comprising the glass cloth according to claim 2.

6. A printed wiring board comprising the glass cloth according to claim 2.

* * * * *